(12) United States Patent
Zuniga et al.

(10) Patent No.: US 7,999,318 B2
(45) Date of Patent: Aug. 16, 2011

(54) HEAVILY DOPED REGION IN DOUBLE-DIFFUSED SOURCE MOSFET (LDMOS) TRANSISTOR AND A METHOD OF FABRICATING THE SAME

(75) Inventors: Marco A. Zuniga, Palo Alto, CA (US); Budong You, Fremont, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

(21) Appl. No.: 12/344,167

(22) Filed: Dec. 24, 2008

(65) Prior Publication Data

US 2009/0224739 A1    Sep. 10, 2009

Related U.S. Application Data

(60) Provisional application No. 61/017,530, filed on Dec. 28, 2007.

(51) Int. Cl.
   *H01L 29/66* (2006.01)

(52) U.S. Cl. .......... 257/343; 257/E29.119; 257/E21.424

(58) Field of Classification Search .................. 257/335, 257/328, 336, 343, 611, E29.119, E29.12, 257/E21.424; 438/305, 197, 204; 323/282
See application file for complete search history.

(56) References Cited

U.S. PATENT DOCUMENTS

| | | | |
|---|---|---|---|
| 5,304,827 A | 4/1994 | Malhi et al. | |
| 5,349,225 A | 9/1994 | Redwine et al. | |
| 6,137,140 A | 10/2000 | Efland et al. | |
| 6,252,278 B1 | 6/2001 | Hsing | |
| 6,424,005 B1 | 7/2002 | Tsai et al. | |
| 6,605,844 B2 | 8/2003 | Nakamura et al. | |
| 6,762,456 B1 | 7/2004 | D'Anna et al. | |
| 6,876,035 B2 | 4/2005 | Abadeer et al. | |
| 6,927,453 B2 | 8/2005 | Shibib et al. | |
| 7,005,703 B2 | 2/2006 | Shibib et al. | |

(Continued)

FOREIGN PATENT DOCUMENTS

EP    1 321 985 A1    6/2003

OTHER PUBLICATIONS

Quirk, "Semiconductor manufacturing technology", 2001, Prentice-Hall., p. 75, Table 4.2.*

(Continued)

*Primary Examiner* — Thomas L Dickey
*Assistant Examiner* — Nikolay Yushin
(74) *Attorney, Agent, or Firm* — Fish & Richardson P.C.

(57) ABSTRACT

A transistor includes a source, a drain and a gate. The source includes a p-doped p-body, a p+ region overlapping the p-body, an n+ region overlapping the p-body in proximity to the p+ region, and an n-doped source, heavily double-diffused (SHDD) region, only into the source region of the transistor, the SHDD region having a depth about equal to that of the first n+ region and overlapping the first n+ region. The drain includes a second n+ region and an n-doped shallow drain overlapping the second n+ region. The gate includes a gate oxide and a conductive material over the gate oxide. The SHDD region extends further laterally than the first n+ region beneath the gate oxide. The SHDD region is implanted using a dopant concentration greater than that of the n-doped shallow drain but less than that of the first n+ region.

14 Claims, 10 Drawing Sheets

U.S. PATENT DOCUMENTS

| | | |
|---|---|---|
| 7,038,274 B2 | 5/2006 | You et al. |
| 7,074,659 B2 | 7/2006 | Zuniga et al. |
| 7,163,856 B2 | 1/2007 | You et al. |
| 7,220,633 B2 | 5/2007 | You et al. |
| 7,671,411 B2 | 3/2010 | You et al. |
| 2001/0009790 A1 | 7/2001 | Hsing |
| 2002/0011626 A1 | 1/2002 | Croce et al. |
| 2002/0017697 A1 | 2/2002 | Kitamura et al. |
| 2003/0038316 A1 | 2/2003 | Tsuchiko et al. |
| 2003/0128015 A1* | 7/2003 | Zuniga et al. ............ 323/282 |
| 2003/0141559 A1 | 7/2003 | Moscatelli et al. |
| 2005/0006701 A1 | 1/2005 | Sung et al. |
| 2005/0017297 A1 | 1/2005 | Shimizu et al. |
| 2005/0106825 A1 | 5/2005 | You et al. |
| 2005/0205897 A1 | 9/2005 | Depetro et al. |
| 2005/0227448 A1 | 10/2005 | Chen et al. |
| 2006/0157781 A1 | 7/2006 | Takimoto et al. |
| 2006/0205168 A1 | 9/2006 | Zuniga et al. |
| 2007/0111457 A1 | 5/2007 | You et al. |
| 2007/0166896 A1 | 7/2007 | You et al. |
| 2007/0207600 A1* | 9/2007 | You et al. ............ 438/527 |

OTHER PUBLICATIONS

Office Action in Chinese Application No. 2007100800492, dated Sep. 4, 2009, 12 pages.

Wolf, Stanley, Ph.D., "Silicon Processing For The VLSI Era," vol. 3: The Submicron MOSFET, Lattice Press, Copyright 1995, 5 pages.

Authorized Officer Keun Yong Park, International Search Report for Application No. PCT/US2008/088439, dated Aug. 12, 2009, 11 pages.

Request for Ex Parte Reexamination and Order Granting Request for Ex Parte Reexamination, Control No. 90/011,100 (Re-examination of US Patent No. 7,671,411), 90 pages, Jul. 19, 2010.

Supplemental European Search Report, Application No. 08868218.2, dated Jun. 24, 2011, 4 pages.

Nehrer, W. et al., "The Optimization of LBC6 Power/Mixed-Signal IC BICMOS Process," IEEE Bipolar/ICMOS Circuits and Technology Meeting, Sep. 30, 2001, pp. 192-195.

Versari, Roberto et al., "Experimental Study of Hot-Carrier Effects in LDMOS Transistors," IEEE Transactions on Electron Devices, vol. 46, N. 6, Jun. 1999, pp. 1228-1233.

* cited by examiner

P-Body implanted after gate formation disrupts CMOS thermal budget

P-Body implanted after gate formation disrupts CMOS thermal budget

P-Body implanted after gate formation disrupts CMOS thermal budget

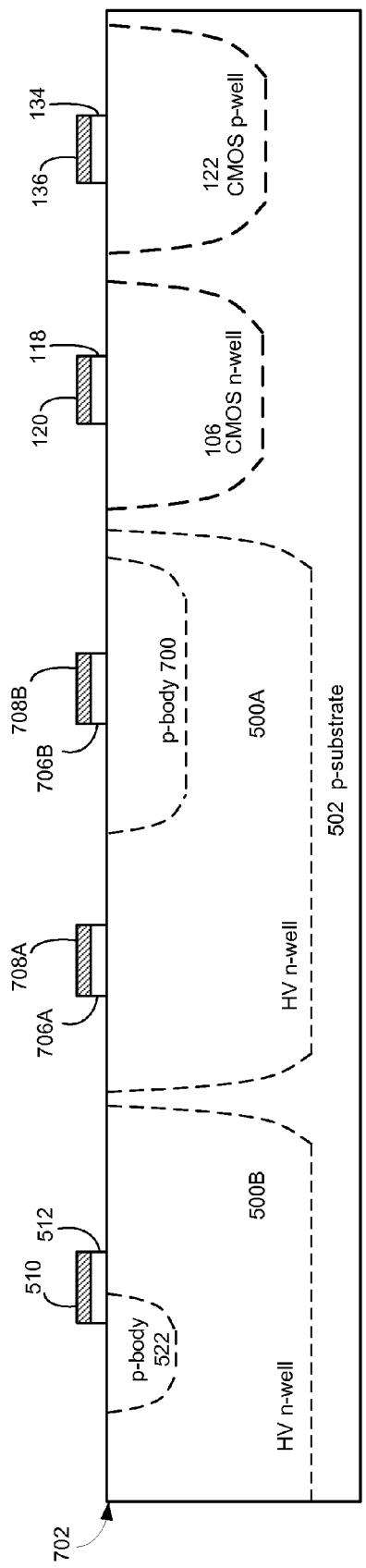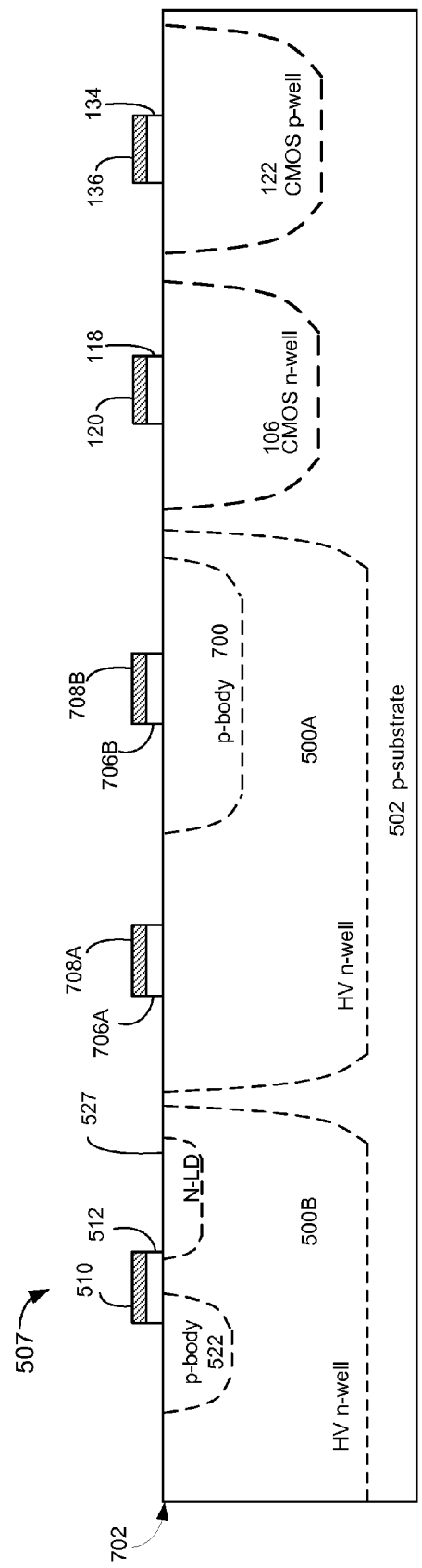

HEAVILY DOPED REGION IN DOUBLE-DIFFUSED SOURCE MOSFET (LDMOS) TRANSISTOR AND A METHOD OF FABRICATING THE SAME

CROSS-REFERENCE TO RELATED APPLICATIONS

This application claims priority to U.S. Application Ser. No. 61/017,530, filed on Dec. 28, 2007, the entire disclosure of which is incorporated by reference.

TECHNICAL FIELD

The present invention relates to semiconductor devices.

BACKGROUND

Voltage regulators, such as DC to DC converters, are used to provide stable voltage sources for electronic systems. Switching voltage regulators (or simply "switching regulators") are known to be an efficient type of DC to DC converter. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

LDMOS transistors are commonly used in switching regulators as a result of their performance in terms of a tradeoff between their specific on-resistance ($R_{dson}$) and drain-to-source breakdown voltage ($BV_{d\_s}$). Conventional LDMOS transistors are typically fabricated having optimized device performance characteristics through a complex process, such as a Bipolar-CMOS (BiCMOS) process or a Bipolar-CMOS-DMOS (BCD) process, that includes one or more process steps that are not compatible with sub-micron CMOS processes typically used by foundries specializing in production of large volumes of digital CMOS devices (e.g, 0.5 μm DRAM production technologies), as described in greater detail below. As a result, conventional LDMOS transistors are, therefore, not typically fabricated at such foundries.

A typical sub-micron CMOS process used by foundries specializing in production of large volumes of digital and mixed signal CMOS devices, referred to herein as sub-micron CMOS process, will now be described. A sub-micron CMOS process is generally used to fabricate sub-micron CMOS transistors—i.e., PMOS transistors and/or NMOS transistors having a channel length that is less than 1 μm. FIG. 1 shows a PMOS transistor 100 and an NMOS transistor 102 fabricated through a sub-micron CMOS process on a p-type substrate 104. The PMOS transistor 100 is implemented in a CMOS n-well 106. The PMOS transistor 100 includes a source region 108 and a drain region 110 having p-doped p+ regions 112 and 114, respectively. The PMOS transistor 100 further includes a gate 116 formed of a gate oxide 118 and a polysilicon layer 120. The NMOS transistor 102 is implemented in a CMOS p-well 122. The NMOS transistor 102 includes a source region 124 and a drain region 126 having n-doped n+ regions 128 and 130, respectively. The NMOS transistor 102 further includes a gate 132 formed of a gate oxide 134 and a polysilicon layer 136.

FIG. 2 illustrates a sub-micron CMOS process 200 that can be used to fabricate large volumes of sub-micron CMOS transistors (such as the CMOS transistors shown in FIG. 1). The process 200 begins with forming a substrate (step 202). The substrate can be a p-type substrate or an n-type substrate. Referring to FIG. 1, the CMOS transistors are fabricated on a p-type substrate 104. A CMOS n-well 106 for the PMOS transistor and a CMOS p-well 122 for the NMOS transistor are implanted into the substrate (step 204). The gate oxide 118, 134 of each CMOS transistor is formed, and a CMOS channel adjustment implant to control threshold voltages of each CMOS transistor is performed (step 206). A polysilicon layer 120, 136 is deposited over the gate oxide 118, 134, respectively (step 208). The p+ regions of the PMOS transistor and the n+ regions of the NMOS transistor are implanted (step 210). The p+ regions 112, 114 and n+ regions 128, 130 are highly doped, and provide low-resistivity ohmic contacts. In a sub-micron CMOS process, formation of an n+ region typically occurs through a three-step process in a single masking and photolithography step as follows: 1) a lightly doped n-type impurity region is implanted, 2) an oxide spacer is formed, and 3) a heavily doped n+ impurity region is implanted. Formation of a p+ region occurs in a similar manner. The formation such n+ and p+ regions allow transistors to have an improved hot carrier performance.

Foundries specializing in production of large volumes of digital CMOS devices generally have fixed parameters associated with the foundries' sub-micron CMOS process. These fixed parameters are typically optimized for the mass production of digital sub-micron CMOS transistors. For example, in process step 206, the CMOS channel adjustment implant generally has an associated thermal budget that is typically fixed, and has parameters optimized for mass production of sub-micron CMOS transistors.

As discussed above, conventional LDMOS transistors typically achieve optimized device performance through a complex process, such as a BiCMOS process or a BCD process, that includes one or more process steps that are not compatible with a sub-micron CMOS process optimized for the mass production of digital sub-micron CMOS transistors.

FIG. 3A shows a conventional LDMOS transistor 300 fabricated through a BiCMOS process on a p-type substrate 302. The LDMOS transistor 300 includes source region 304 with an n-doped n+ region 306, a p-doped p+ region 308, and a p-doped p-body diffusion (p-body) 310. The LDMOS transistor 300 also includes a drain region 312 with an n-doped n+ region 314 and an n-type well (HV n-well) 316, and a gate 318, including a gate oxide 320 and a polysilicon layer 322.

In the BiCMOS process, the gate oxide 320, and gate oxide of any CMOS transistors fabricated in the BiCMOS process, is formed prior to implantation of the n+ region 306 and the p-body 310. The BiCMOS process, therefore, allows the gate 318 to serve as a mask during implantation of the n+ region 306 and the p-body 310—i.e., the n+ region 306 and the p-body 310 are self aligned with respect to the gate 318. The self aligned lateral double diffusion of the n+ region 306 and the p-body 310 forms the channel of the LDMOS transistor 300.

Such kinds of self aligned double diffusions are not easily integrated into a sub-micron CMOS process because the subsequent drive-in step (or thermal budget) associated with self aligned double diffusions disrupts the fixed thermal budget associated with sub-micron CMOS process steps (e.g., process step 206) and requires a redesign of the thermal budget allocated to the sub-micron CMOS process steps. That is, the self aligned double diffusions generally includes a drive-in step with a long duration and a high temperature that can cause the characteristics of sub-micron CMOS transistors (e.g., threshold voltages) to shift.

The lateral doping profile in region (a) of the LDMOS transistor 300 controls the tradeoff between the on-resistance $R_{dson}$ and the drain-to-source breakdown voltage $BV_{d\_s}$. The vertical doping profile in region (b) determines the drain-to-substrate breakdown voltage $BV_{d\_sub}$ of the LDMOS transistor, and the pinch-off doping profile in region (c) determines the source-to-substrate punch-through breakdown voltage $BV_{s\_sub}$ of the LDMOS transistor. The source-to-substrate punch-through breakdown voltage $BV_{s\_sub}$ is an important parameter for an LDMOS transistor with a floating operation requirement, e.g, an LDMOS transistor implemented as a high-side control switch in a synchronous buck circuit configuration.

FIG. 3B shows a conventional LDMOS transistor 330 fabricated through a BCD process on a p-type substrate 332. The LDMOS transistor 330 includes source region 334 with an n-doped n+ region 336, a p-doped p+ region 338, and a p-doped p-body 340. The LDMOS transistor 330 also includes a drain region 342 with an n-doped n+ region 344 and an n-type layer (HV n-Epi) 346, and a gate 348, including a gate oxide 350 and a polysilicon layer 352. As with the BiCMOS process, in the BCD process, the gate oxide 350, and gate oxide of any CMOS transistors fabricated in the BCD process, is formed prior to implantation of the n+ region 336 and the p-body 340.

In the BCD process, an n+ buried layer 354 can be grown on the p-type substrate 332 to improve the source-to-substrate punch-through breakdown characteristics of the LDMOS transistor. Such an approach offers an improved tradeoff between the on-resistance $R_{dson}$ and drain-to-source breakdown voltage $BV_{d\_s}$ of the LDMOS transistor as the lateral doping profile of the LDMOS transistor can be optimized without constrain on the vertical doping profiles. However, such a BCD process includes the growth of the HV n– Epi layer 346, and this step is generally not compatible with a sub-micron CMOS process.

Another approach used in a BCD process is to utilize an n– layer 360 implanted in the drain region 362 of the LDMOS transistor 364 as shown in FIG. 3C. The n– layer 360, n+ region 366, and p-body 368 are self aligned with respect to the gate 370—i.e., the n– layer 360, n+ region 366, and p-body 368 are implanted after formation of gate oxide 372. The inclusion of the n– layer 360 provides an additional parameter to further optimize the tradeoff between the on-resistance $R_{dson}$ and drain-to-source breakdown voltage $BV_{d\_s}$ of the LDMOS transistor. Similar to the n+ buried layer approach of FIG. 3B, the inclusion of the n– layer 360 at the surface provides a method to decouple vertical and horizontal doping constraints.

SUMMARY

In one aspect, a method of fabricating a transistor having a source region, a drain region, and a gate region on a substrate, includes implanting, into a surface of the substrate, a n-doped n-well, forming a gate oxide between a source region and a drain region of the transistor, covering the gate oxide with a conductive material, implanting, into the source region of the transistor, a p-doped p-body, implanting, into the source region of the transistor, a first n-doped n+ region to overlap the p-body, implanting, only into the source region of the transistor, a source, heavily double-diffused (SHDD) region to overlap the p-body, the SHDD region being an n-doped region implanted to a depth about equal to that of the first n-doped n+ region, the SHDD region extending further laterally than the first n-doped n+ region beneath the gate oxide, a portion of the SHDD region overlapping a portion of the first n-doped n+ region, implanting, into the source region of the transistor, a p-doped p+ region, the p-doped p+ region in proximity to the first n-doped n+ region, implanting, into the drain region of the transistor, a second n-doped n+ region, and implanting into the drain region an n-doped shallow drain, wherein the SHDD region is implanted using a dopant concentration greater than that used in the implant of the n-doped shallow drain but less than that used in the implant of the first n-doped n+ region.

Implementations can include one or more of the following. The SHDD region can encompass the entire first n-doped n+ region. An oxide spacer may be formed on each side of the gate oxide after implanting the SHDD but before implanting the first n-doped n+ region and the second n-doped n+ region. The oxide spacer may be formed prior to formation of the first n-doped n+ region and the second n-doped n+ region. The SHDD may be formed after formation of the gate oxide. In the source region, a surface area of the SHDD region, a surface area of the first n-doped n+ region, and a surface area of the p-doped p+ region may be located within a surface area of the p-doped p-body. The p-doped p+ region may abuts the first n-doped n+ region.

In another aspect, a transistor includes a source, a drain and a gate to control a depletion region between the source and the drain. The source includes a p-doped p-body, a p-doped p+ region overlapping the p-body, a first n-doped n+ region overlapping the p-body in proximity to the p-doped p+ region, and a n-doped source, heavily double-diffused (SHDD) region, only into the source region of the transistor, the SHDD region having a depth about equal to that of the first n-doped n+ region and overlapping the first n-doped n+ region. The drain includes a second n-doped n+ region and an n-doped shallow drain overlapping the second n-doped n+ region. The gate includes a gate oxide and a conductive material over the gate oxide. The SHDD region extends further laterally than the first n-doped n+ region beneath the gate oxide. The SHDD region is implanted using a dopant concentration greater than that used in the implant of the n-doped shallow drain but less than that used in the implant of the first n-doped n+ region.

Implementations can include one or more of the following. The second n+ region may extend deeper than the n-doped shallow drain. The SHDD region may encompass the entire first n-doped n+ region. The p-doped p+ region may abut the first n-doped n+ region.

In another aspect, a method of fabricating a transistor having a source region, a drain region and a gate region on a substrate, includes forming a gate oxide between a source region and a drain region of the transistor, covering the gate oxide with a conductive material, implanting, into the source region of the transistor, a p-doped p-body, implanting, into the source region of the transistor, a first n-doped n+ region overlapping the p-body, implanting, only into the source region of the transistor, a source, heavily double-diffused (SHDD) region to overlap the p-body, a portion of the SHDD region overlapping a portion of the first n-doped n+ region, the SHDD region extending further laterally than the first n-doped n+ region beneath the gate oxide, implanting, into the source region of the transistor, a p-doped p+ region overlapping the p-body, the p-doped p+ region in proximity to the first n-doped n+ region, implanting, into the drain region of the transistor, a second n-doped n+ region, implanting into the drain region an n-doped shallow drain, the n-doped shallow drain extending beneath the gate oxide to contact the p-doped p-body, and implanting, into the source region of the transistor, a p-doped p+ region.

Implementations can include one or more of the following. The SHDD region may encompass the entire first n-doped n+ region. The SHDD region may be implanted to a depth about equal to that of the first n-doped n+ region. The SHDD region may be implanted using an impurity concentration lower than that used in implanting of the first n-doped n+ region. The SHDD region may be implanted using a level of dopant greater than that used in the implant of the n-doped shallow drain. The p-doped p+ region may abut the first n-doped n+ region.

In another aspect, a transistor includes a source, a drain and a gate to control a depletion region between the source and the drain. The source includes a p-doped p-body, a p-doped p+ region overlapping the p-body, a first n-doped n+ region overlapping the p-body in proximity to the p-doped p+ region, and a n-doped source, heavily double-diffused (SHDD) region only in the source region of the transistor, the SHDD region overlapping the p-body, a portion of the SHDD region overlapping the first n-doped n+ region. The drain includes a second n-doped n+ region and an n-doped shallow drain. The gate includes a gate oxide and a conductive material over the gate oxide. The SHDD region extending further laterally than the first n-doped n+ region beneath the gate oxide. The n-doped shallow drain extends beneath the gate oxide to contact the p-doped p-body.

Implementations can include one or more of the following. The second n+ region may extend deeper than the n-doped shallow drain. The second n-doped n+ region may be self-aligned to the gate of the transistor. The first n+ region may be surrounded by the p-body. The p-body may be deeper than the p+ region, the first n+ region and the SHDD region. The SHDD region may encompass the entire first n-doped n+ region. The SHDD region may be implanted to a depth about equal to that of the first n-doped n+ region. The SHDD region may be implanted using a impurity concentration less than that used in the implant of the first n-doped n+ region. An outer boundary of the SHDD region may be aligned with an outer boundary of the first n-doped n+ region. The p-doped p+ region may abut the first n-doped n+ region.

In another aspect, a voltage regulator has an input terminal to be coupled to an input voltage source, an output terminal to be coupled to a load, a power switch including a transistor of an aspect above, and a filter to provide a generally DC output voltage at the output terminal. A duty cycle of the power switch controlling power supplied to the output terminal.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 6A-6L illustrate the exemplary processes of manufacturing an SHDD LDMOS transistor, a PMOS transistor, and an NMOS transistor, according to the exemplary processes of FIG. 6.

Like reference symbols in the various drawings indicate like elements.

DETAILED DESCRIPTION

Figure 1:
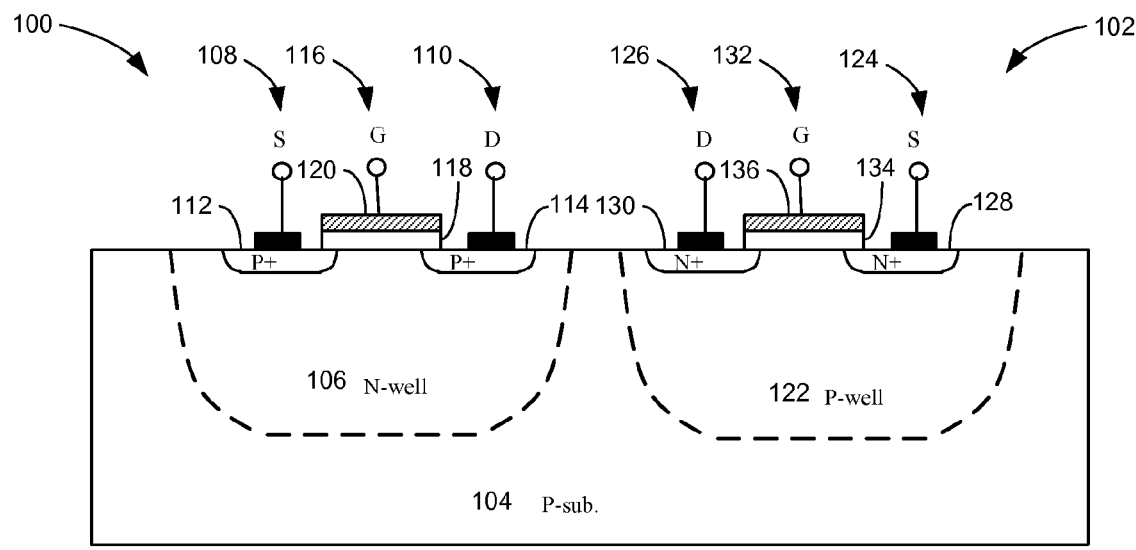
FIG. 1 is a schematic cross-sectional view of a conventional PMOS transistor and NMOS transistor formed on a p-type substrate.
Figure 2:
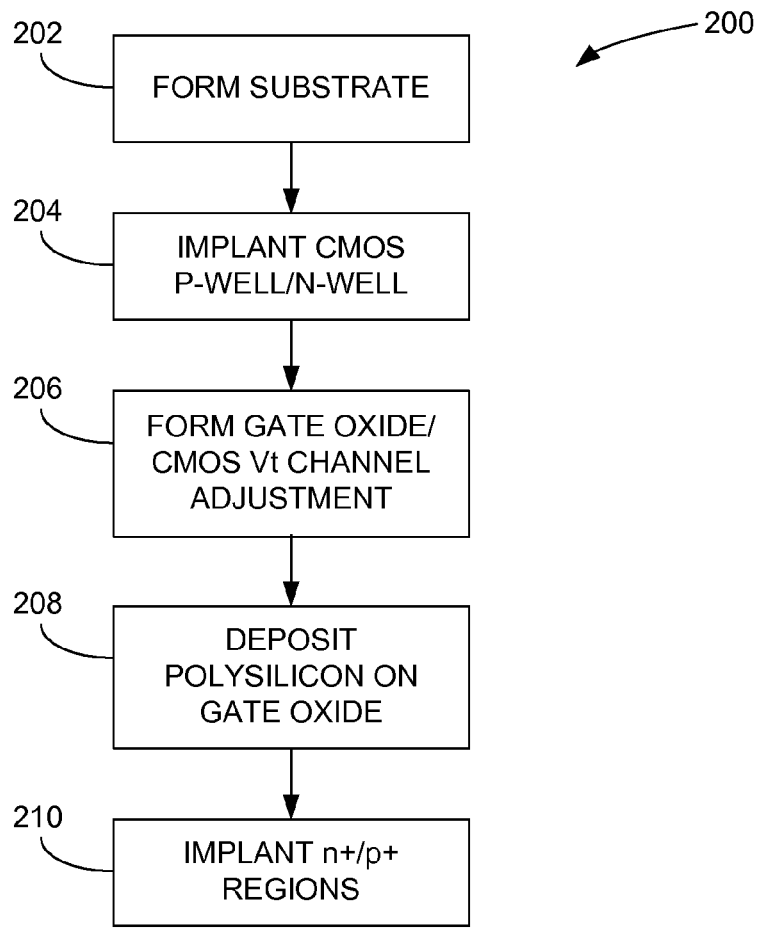
FIG. 2 is a flow diagram illustrating a conventional sub-micron CMOS process for manufacturing CMOS transistors.
Figure 3A:
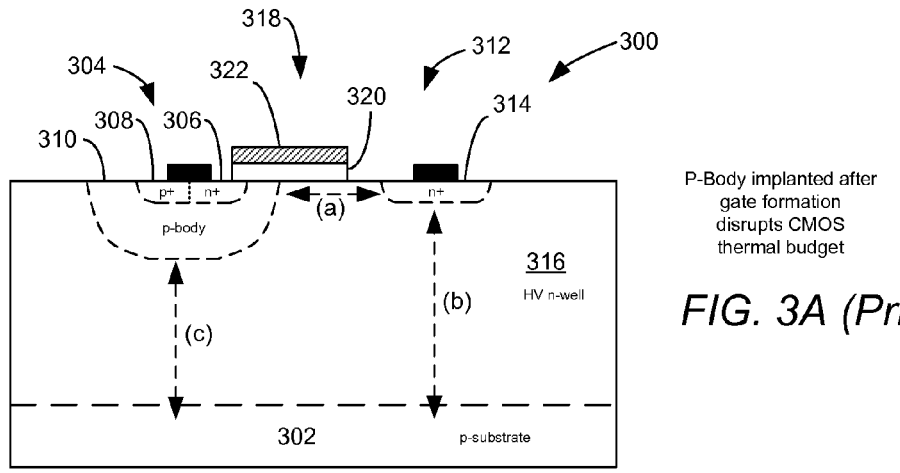
FIGS. 3A, 3B, and 3C are schematic cross-sectional views of conventional LDMOS transistors.
Figure 3B:
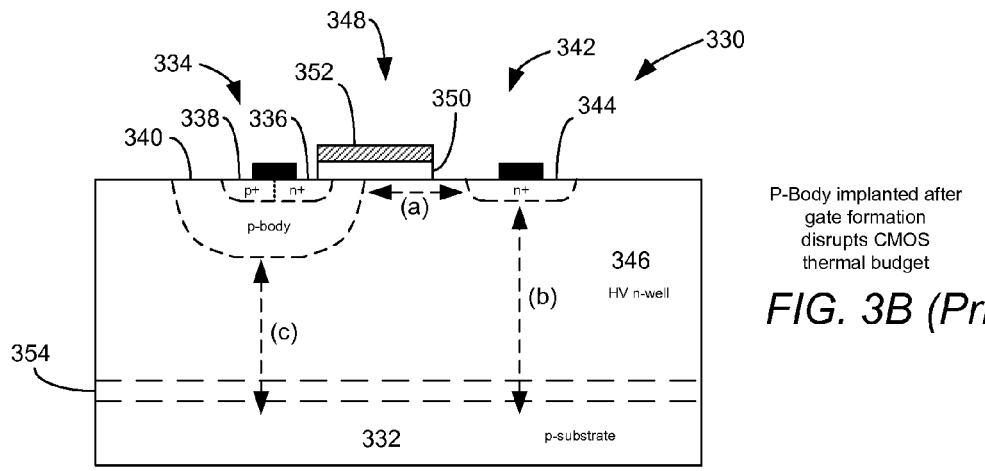
Figure 3C:
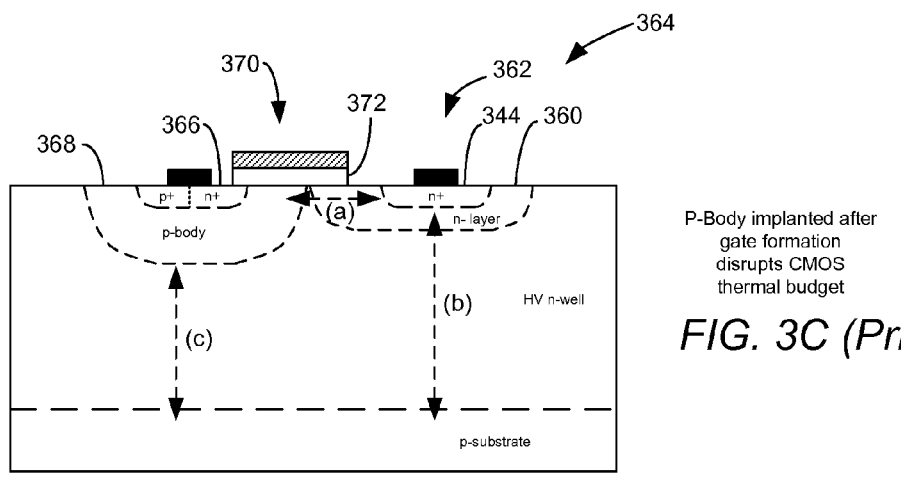
Figure 4A:
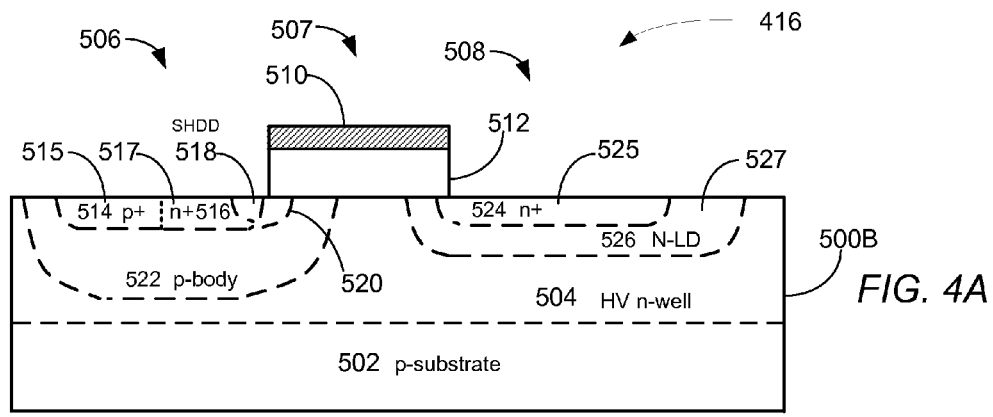
FIGS. 4A-4B are schematic cross-sectional views of an SHDD LDMOS transistor, and a three-dimensional view of the surface area of the source and drain regions of the SHDD LDMOS transistor, respectively.

FIG. 4A shows a schematic cross-sectional view of certain implementations of the LDMOS transistor 416. The LDMOS transistor 416 can be a power switch, e.g., a power switch in a voltage regulator, e.g., a low-side power switch connecting an intermediate terminal to ground in a buck converter topology, a high-side power switch connecting an input voltage to ground in a buck converter topology, or a power switch in boost converter topology, buck-boost converter topology, or various transformer-coupled topologies. In such a voltage regulator, a duty cycle of the power switch controls power supplied to the output terminal, and filter provides a generally DC output voltage at the output terminal.

The LDMOS transistor 416 can be fabricated on a n-type well (HV n-well) 500B, such as a high-voltage n-type well, implanted in a p-type substrate 502. An HV n-well implant is typically a deep implant and is generally more lightly doped relative to a CMOS n-well. The HV n-well 500B can have a retrograded vertical doping profile. The LDMOS transistor 416 generally includes a source region 506, a drain region 508, and a gate 507.

Referring again to FIG. 4A, the source region 506 generally includes a p-doped p+ region 515, an n-doped n+ region 517, and a p-doped p-body 522. The drain region 508 generally includes an n-doped n+ region 525 and an n-doped shallow drain (N-LD) 527. The n+ region 525 can be shallower than the N-LD 527 (as shown in FIG. 4A), or the n+ region 525 can extend deeper than the N-LD 527 (as shown in FIG. 4C). The source region 506 further includes an n-type source, heavily double-diffused (SHDD) region 518 (in some contexts, the SHDD region can be considered to be part of the n+ region). The SHDD region 518 of the LDMOS transistor can be implanted using similar techniques performed with respect to N-LDD regions in conventional CMOS processes.

As shown, the SHDD region 518 overlaps a portion of the n-doped n+ region, and can extend under the gate oxide 512 further than the n+ region 517. In these implementations, the SHDD can be implanted before the formation of the oxide spacer, thus permitting the SHDD region 518 to extend further into the channel than the n+ region 517.

If the N-LDD regions the CMOS transistors on the substrate use similar doping depth and concentration, then the SHDD region 518 can be implanted simultaneously and with the same process as the N-LDD regions in any CMOS transistors on the substrate. Separate masks can be employed for implanting the SHDD region 518 and the n-doped n+ region 517, thus permitting placing the SHDD selectively on the source regions. Alternatively, the SHDD region 518 and the n-doped n+ region 517 can be implanted using a same mask to control, for example, the overlapping region between the SHDD region 518 and the n-doped n+ region 517. In these implementations, the n-doped n+ region 525 in the drain would be implanted using a mask different from that used in forming the n-doped n+ region 517 in the source so that no SHDD is implanted in the drain. Using different masks also can provide flexibility with respect to, for example, the relative dopant concentration of the n doped n+ region 525 and the n-doped n+ region 517.

In some implementations, the SHDD region 518 can extend to about the same depth as the n-doped n+ region 517 (i.e., SHDD region 518 can extend to about the same depth into the substrate 502 as does the n-doped n+ region 517). The boundary of the SHDD region 518 farther from the gate can be located closer to the gate than the outer boundary of n-doped n+ region 517, or it can be aligned with a boundary of the n-doped n+ region 517 and abut the boundary of the p-doped p+ region 515.

The HV n-well 500B, the N-LD 527, and the n+ region 525 in the drain region 508 are volumes containing doped material. Likewise, the n+ region 517, the p+ region 515, and the p-body 522 in the source region 506 are volumes containing doped material. In some implementations, both the N-LD 527 and the HV n-well 500B can have a lower concentration of impurities than that of the n+ regions 517 and 525. Portions at which these volumes overlap may have a higher doping concentration than the individual volumes separately. For example, a portion 524 that contains the overlapping volumes of the n+ region 525, the N-LD 527, and the HV n-well 500A can have the highest doping concentration among other overlapping volume portions. A portion 526 that contains the overlapping volumes of the N-LD 527 and the HV n-well 500B excluding the n+ region 525, can have a lower doping concentration than that of the portion 524. A portion 504 that only includes the HV n-well 500B can have a lower doping concentration than that of the portion 524 or 526, because it does not include multiple overlapping doped volumes.

The SHDD region 518 may be implanted using a lower doping concentration implantation step than that used for the n+ region 517, and a higher doping concentration implantation step than that used for N-LD region 526. Thus, in some implementations, the portions in which the SHDD region 518 and the n+ region 517 overlap can have a higher doping concentration of impurities than the non-overlapping portions. In these implementations, the volume containing the SHDD region 518 (i.e., SHDD portion 520) can also have a doping concentration higher than that of the p-body 522.

Figure 4B:
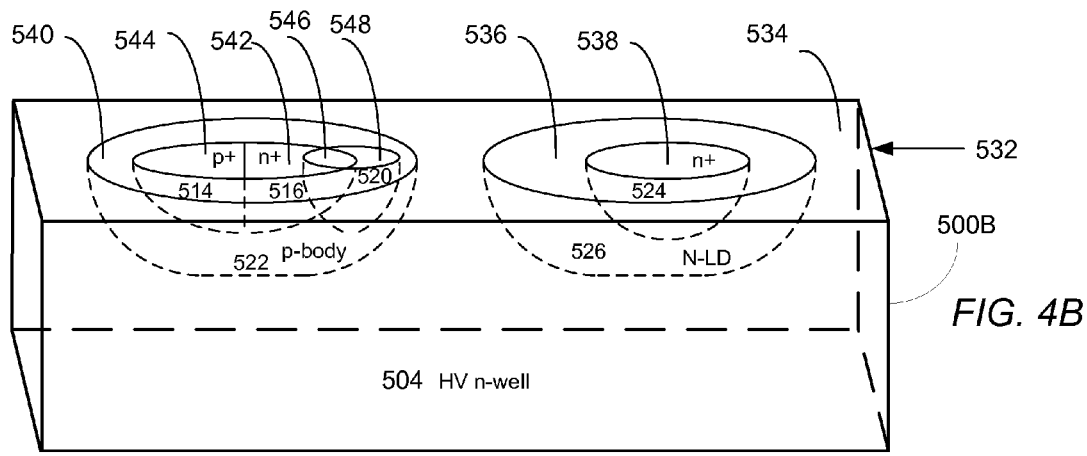
Figure 4C:
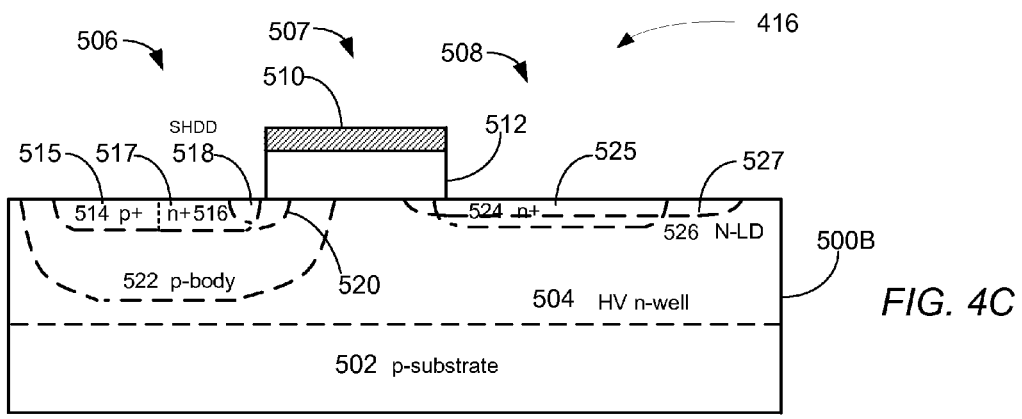
FIG. 4C is a schematic cross sectional views of another implementation of a SHDD LDMOS transistor.

Referring to FIG. 4B, volumes of the p+ region 514, n+ regions 516 and 524, SHDD region 520, p-body 522 and N-LD region 526 can each have surface areas on the surface 532 of the LDMOS transistor 416. The HV n-well 500B has a surface area 534. For example, in the drain region 508, the portion 526 of the N-LD region has a surface area 536 located within the surface area of the HV n-well 500B. The portion 524 of the n+ region has a surface area 538 located within the surface area 536 of the portion 526 of the N-LD region. In the source region 506, the p-body 522 has a surface area 540 located within the surface area 534. The portion 514 of the p+ region and the portion 516 of the n+ region have a surface area 544 and 542, respectively, each being located within the surface area 540 of the p-body 522.

In implementations where a SHDD region 518 is diffused into the p-body 522, the portion 520 of the SHDD region 518 also can have a surface area 548 located within the surface area 534. The portion of the SHDD region 518 overlapping the portion 516 of the n+ region can have a surface area 546 on the LDMOS transistor 416.

Figure 5:
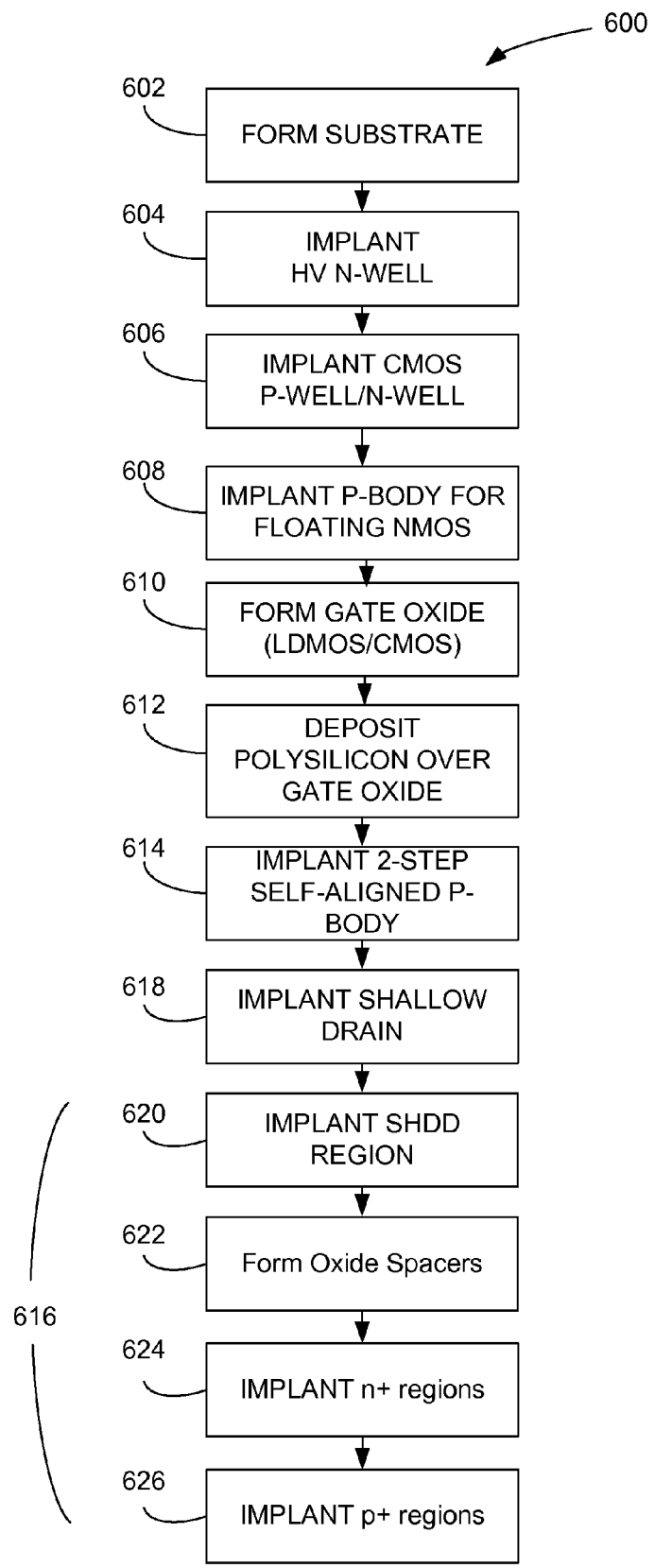
FIG. 5 is a flow diagram illustrating an exemplary process for manufacturing a semiconductor transistor, including an SHDD LDMOS transistor, that is compatible with a sub-micron CMOS process.

FIG. 5 illustrates an exemplary process 600 of fabricating a semiconductor device, including an SHDD LDMOS transistor, a PMOS transistor with floating operation capability (i.e., the source of the transistor is not grounded), and an NMOS transistor with floating operation capability, that is compatible with a sub-micron CMOS process.

Figure 6A:
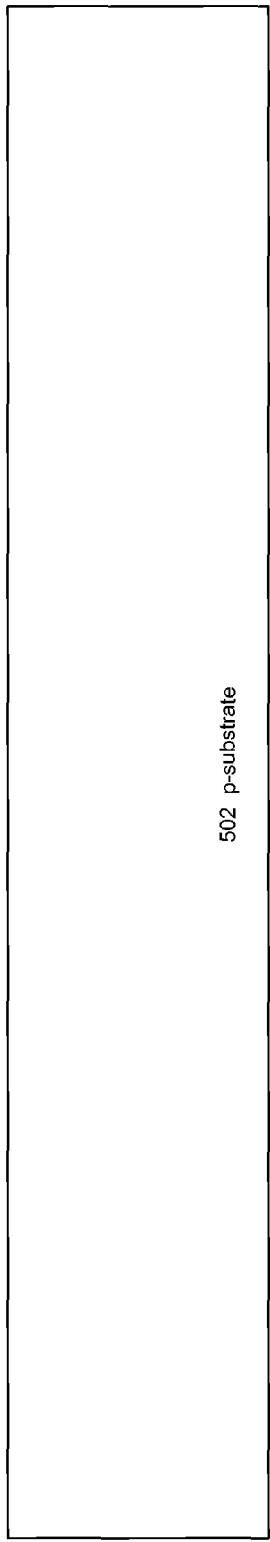
Figure 6B:
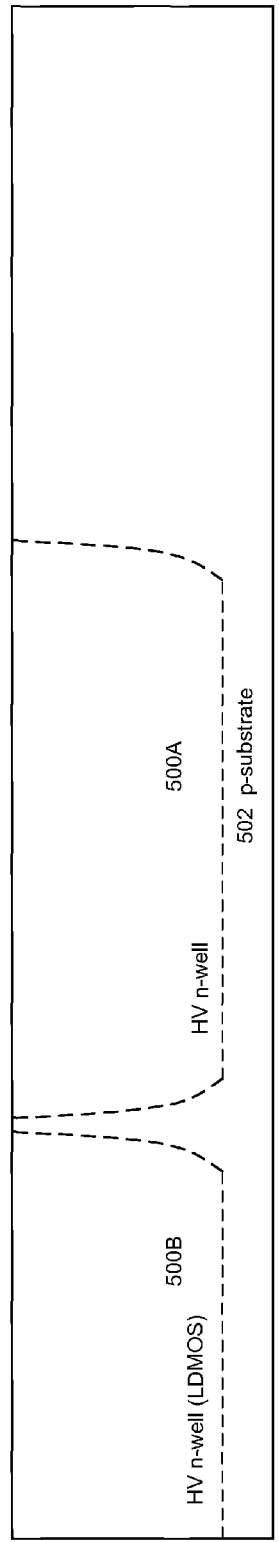

Process 600 begins with forming a substrate (step 602). The substrate can be a p-type substrate or an n-type substrate. Referring to the example of FIG. 6A, a semiconductor layer including a p-type substrate 502 is formed. Next, as shown in FIG. 6B, HV n-wells 500A for the LDMOS transistor, and 500B for the PMOS transistor with floating operation capability and NMOS transistor with floating operation capability, are implanted into the p-type substrate 502 (step 604). In some implementations, the HV n-wells 500A and 500B can be integrated as a single well. Alternatively, the HV n-wells 500A and 500B can be implanted as separate wells. The HV n-wells 500A and 500B also can be implanted simultaneously or sequentially.

Figure 6C:
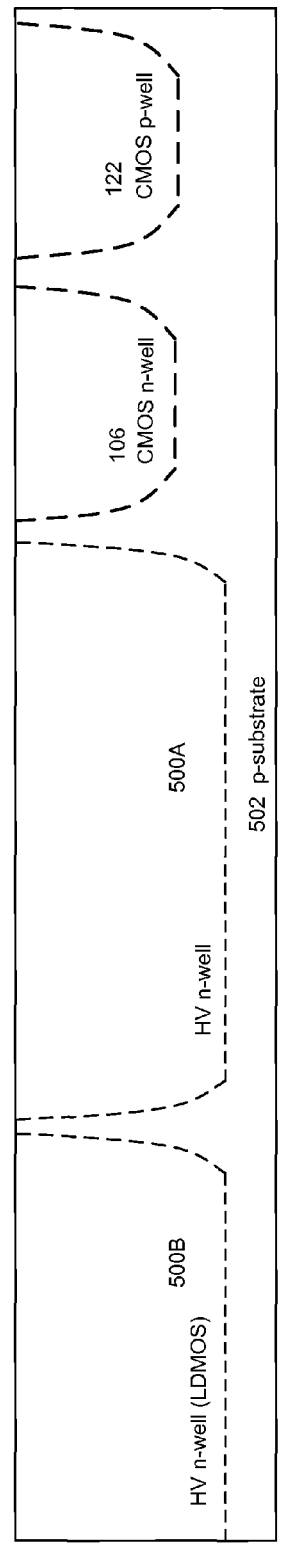

A CMOS n-well 106 (for example, for a PMOS transistor), and a CMOS p-well 122 (for example, for a NMOS transistor), are implanted into the p-type substrate 502, as illustrated in FIG. 6C (step 606). While it is illustrated that the CMOS n-well 106 and the CMOS p-well 122 are formed after the HV n-wells 500A and 500B, the order can be reversed so that the CMOS n-well 106 and the CMOS p-well 122 are formed prior to implanting the HV n-wells 500A and 500B. In some implementations, the HV n-wells 500A and 500B, and the CMOS n-well 106, can be implanted simultaneously, for example, by using a single mask. In other implementations, each of the HV n-wells 500A and 500B, and the CMOS n-well 106, can be implanted sequentially (and in any order).

Figure 6D:
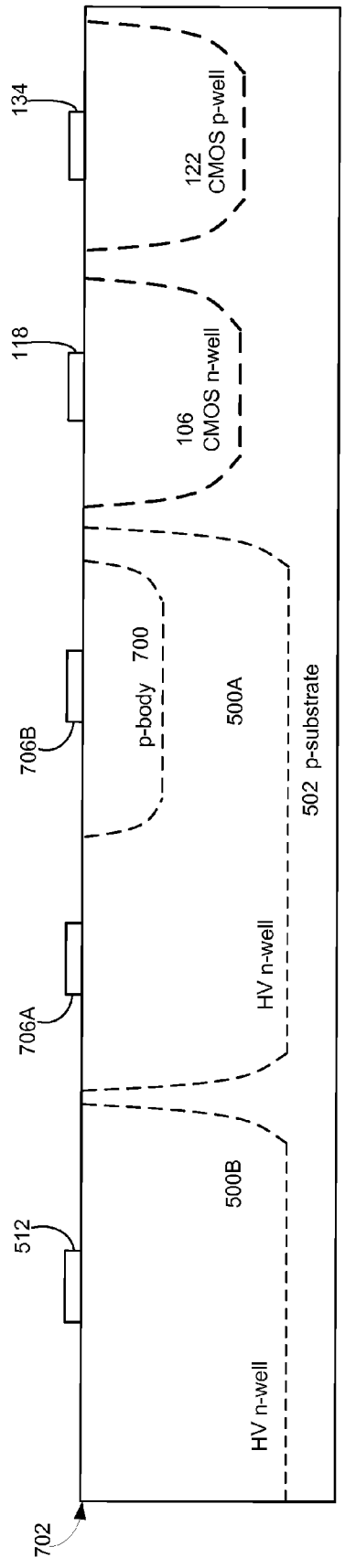

Referring to FIG. 6D, a p-body for the NMOS transistor with floating operation capability can be implanted (step 608). For example, a p-body 700 for the NMOS transistor with floating operation capability can be implanted into the HV n-well 500A.

After implantation of the p-body 700 for the floating NMOS transistor, the gate oxide for each of the LDMOS transistor, the PMOS transistor with floating operation capability, the NMOS transistor with floating operation capability, and the CMOS transistors, can be formed (step 610). In some implementations, each gate oxide can be simultaneously or sequentially formed. For instance, the gate oxide for the LDMOS transistor can be formed at the same time as the gate oxide of the CMOS transistors so that the LDMOS transistor may establish a similar threshold voltage and gate oxide thickness as those of the CMOS transistors. Alternatively, the gate oxide of the LDMOS transistor can be formed at a different time or with a different thickness than the gate oxide of the CMOS transistors to flexibly allow the LDMOS transistor to be implemented with a dedicated gate oxide thickness larger or smaller than that of the CMOS transistors. In these implementations, when the gate oxide of the LDMOS transistor is formed to be thicker than the gate oxide of the CMOS transistors, the LDMOS transistor can allow higher gate drive-in applications where a lower voltage power supply may not be readily available. This flexibility yields optimization of the LDMOS transistor depending on specific requirements of a power delivery application, such as efficiency targets at a particular frequency of operation.

The gate oxide for the LDMOS 512 can be formed on the surface 702 of the p-type substrate 502 above the HV n-well 500B (step 610). Similarly, the gate oxide 706A of the PMOS transistor (with floating operation capability) and the gate oxide 706B of the NMOS transistor (with floating operation capability) can be formed on the surface of the p-type substrate 502 above the HV n-well 500A. Further, the gate oxide 118 and the gate oxide 134 can be formed on the surface of the p-type substrate 502 above the CMOS n-well 106, and on the surface of the p-type substrate 502 above the CMOS p-well 122, respectively.

Figure 6E:
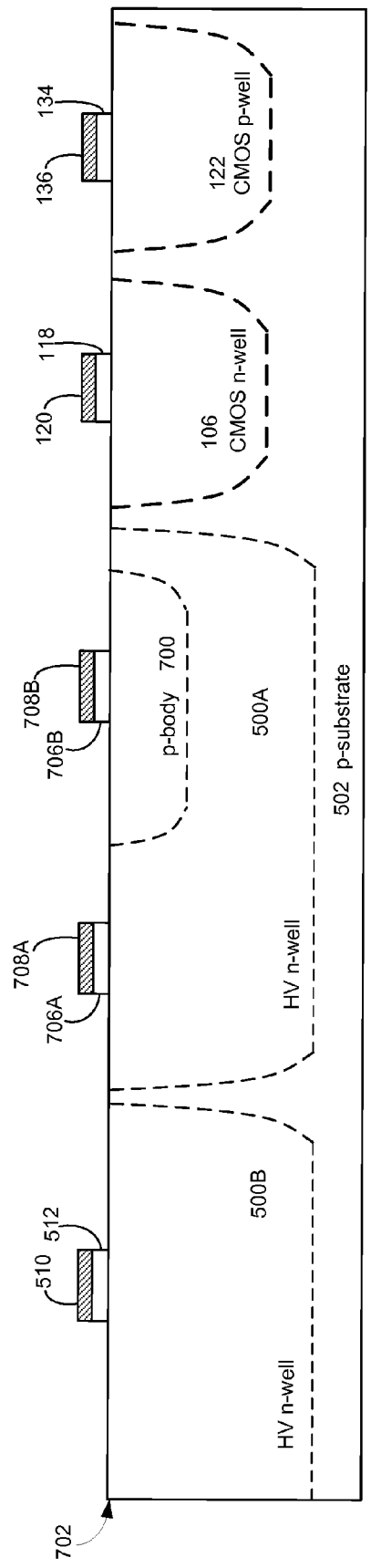

As shown in FIG. 6E, a polysilicon layer is then deposited over the gate oxide (step 612). The polysilicon layer can be used as transistor electrodes for interconnection purposes. As shown in FIG. 6E, polysilicon layers 510, 708A and 708B can be deposited over the gate oxide 512, the gate oxide 706A, and the gate oxide 706B, respectively. Also, a polysilicon layer 120 and a polysilicon layer 136 are deposited over the gate oxide 118 formed above the CMOS n-well 106 and the gate oxide 134 formed above the CMOS p-well 122, respectively.

As illustrated in FIG. 6F, in certain implementations, a self-aligned p-body 522 for the source region of the LDMOS transistor can then be implanted (step 614). The p-body 522 is implanted into the HV n-well 500B in these implementations.

Referring to FIG. 6G, a shallow drain (N-LD) 527 is implanted and diffused into the drain of the LDMOS transistor (step 618). In some implementations, the shallow drain 527 can be implanted before or after the LDMOS gate is formed (i.e., the shallow drain 527 can be non-self aligned or self aligned with respect to the gate 507 of the LDMOS transistor). The shallow drain 527 can be implanted using the LAT implant or a normal angle tilt implant as discussed above.

Figure 6H:
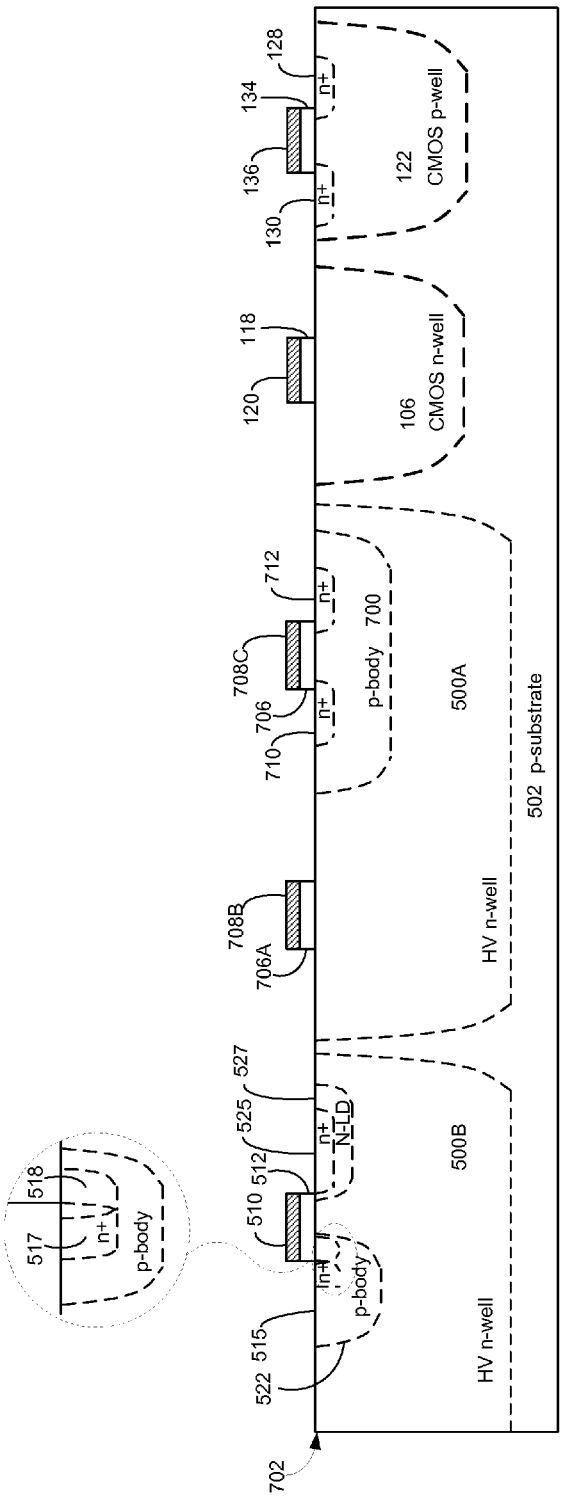

At step 620, implantation for the SHDD region 518 is performed, followed by the implantation for the n+ regions at step 624. Once the SHDD region 518 is formed, as shown in FIG. 6H, the LDMOS transistor is implanted with an n+ region 525 at the drain and an n+ region 517 at the source. The n+ regions 710 and 712 are implanted at the drain and source, respectively, of the NMOS transistor with floating operation capability. The n+ regions 128 and 130 also are implanted at the source and drain regions, respectively, of the CMOS p-well 122.

While it is shown that the SHDD region 518 is implanted prior to implantation for the n+ regions, depending on a desired alignment of the SHDD with respect to the gate, the order can be reversed so that the SHDD regions 518 is implanted after implantation of the n+ regions. In either implementations, the SHDD region 518 can be about the same depth as the n+ region 517 (i.e., the SHDD region 518 extends toward the p-type substrate 502 to about the same depth as the n+ region 517).

Figure 6I:
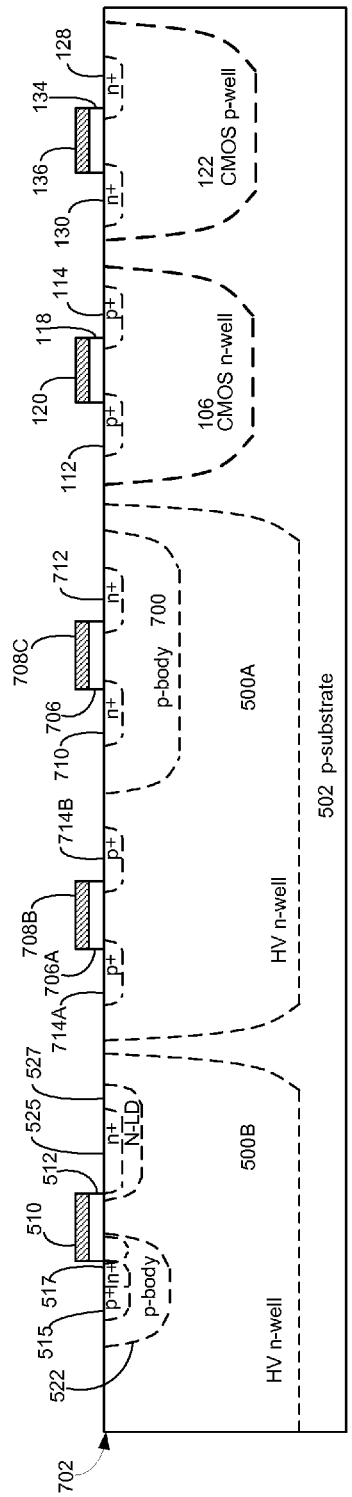

After the SHDD region 518 and the n+ regions are formed, p+ regions of the LDMOS transistor, the PMOS transistor with floating operation capability, the NMOS transistor with floating operation capability, and the CMOS transistors, are implanted (step 626). As shown in FIG. 6I, the p+ regions 714A and 714B are implanted at the drain and source, respectively, of the PMOS transistor with floating operation capability. A p+ region 515 is also implanted at the source of the LDMOS transistor. Separate p+ regions 112, 114, are implanted at the source and drain, respectively, of the PMOS transistor. Each of the p+ regions can be formed separately or simultaneously.

Figure 6J:
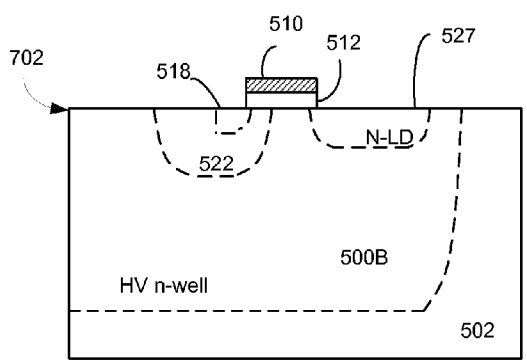
Figure 6K:
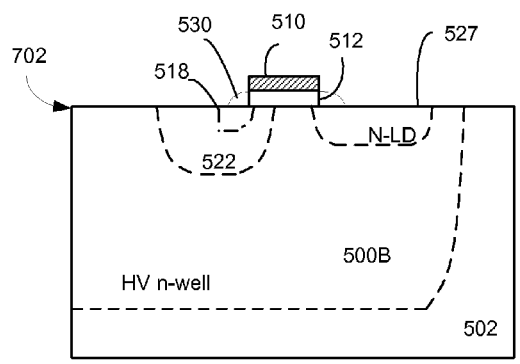
Figure 6L:
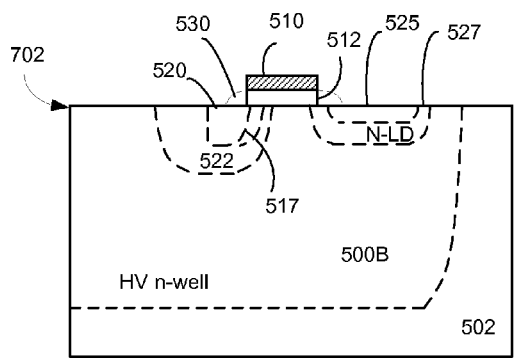

FIGS. 6J-6L show the process of step 616 in more detail. Referring to FIG. 6J, after the shallow drain (N-LD) 527 is implanted and diffused into the drain of the LDMOS transistor (e.g., step 614), the SHDD region 518 is implanted into the source of the LDMOS transistor (step 620). The SHDD region 518 can be implanted to extend under the gate oxide 512 previously formed on the HV n-well. The SHDD region 518 may align with an outer boundary (e.g., the boundary away from the drain) of the n+ region 517, and abut the p+ region 515. Alternatively, the SHDD region 518 may be implanted with a predetermined distance away from the p+ region 515.

Then, as shown in FIG. 6K, a pair of oxide spacers 530 can be formed adjacent to the gate oxide 512 and the polysilicon 510 (step 622). After the oxide spacers are formed, implantation for the n+ regions is performed (step 624). The LDMOS transistor can be implanted with an n+ region at the drain and another n+ region at the source. The n+ region 517 and 525 can be formed over the SHDD region 518 and the N-LD region 527, respectively, as illustrated in FIG. 6L. The n+ regions also can be implanted at the drain and source of the NMOS transistor with floating operation capability, and at the source and drain regions of the CMOS p-well 122. Depending on a design application, the n+ regions can be performed prior to formation of the oxide spacers.

The p+ region can be formed by a two-step implant in a manner similar to the n+ region. That is, a SHDD region can be implanted before formation of the oxide spacer, and a p+ region can be implanted after formation of the oxide spacer.

Because the gate may have some finite source/drain overlap, in these implementations, the gate (or gate oxide) can be formed first and then used as a diffusion or implant mask in defining the source and drain regions so as to preclude the source and/or drain from running under the gate oxide. Once the gate is formed, the gate can serve as a mask during implantation of the n+ regions and the p-body so that they are self-aligned with respect to the gate. As shown, n+ regions 517 and 525 of the LDMOS transistors are implanted and self-aligned with respect to the corresponding gate oxide.

In some implementations, only one side (e.g., the source) of the LDMOS transistor includes an SHDD region. For example, the n+ region 525 can be formed using a one-step process because the drain of the LDMOS transistor does not include a SHDD region.

In some implementations, steps 602-626 may be performed in the order listed, in parallel (e.g., by the same or a different process, substantially or otherwise non-sequentially), or in a different order to achieve the same result. For example, after forming the p-type substrate 502, CMOS n-well 106 and CMOS p-well 122 can be implanted prior to implanting the HV n-wells 500A and 500B. As another example, the p+ regions can be formed prior to implanting the n+ regions, and the SHDD region can be formed prior to implanting the N-LD region. As yet another example, the N-LD region 527 can be implanted prior to forming the gate oxide or implanting the self-aligned p-body.

However, the order discussed above is not limited to that shown. For example, the n+ region 517 can be implanted prior to forming the SHDD region 518, such that the SHDD region 518 self-aligns with the gate oxide 512 and overlaps the n+ region 517 after the SHDD region 518 is subsequently formed.

In some implementations, steps 602-626 may be performed in the order listed, in parallel (e.g., by the same or a different process, substantially or otherwise non-sequentially), or in different order to achieve the same result. For example, n+/p+ regions can be implanted prior to forming the oxide spacers. As another example, the SHDD region can be implanted prior to implanting the N-LD region. As yet another example, the SHDD region can be formed prior to or subsequently after any one of the steps 618, 622, 624 and 626.

In other implementations, depending on a particular design application, one or more of the steps 602-626, or combinations thereof can be bypassed. In yet other implementations, any of the steps 602-626 may be performed by two or more processes rather than by a single process, performed simultaneously or sequentially.

The processes 600 provides a potential advantage over conventional techniques because any channel length variation due to misalignment of the p-body 522 and n+ region 516 can be mitigated and compensated by a greater critical dimension (CD) control of the process 600.

Also, PMOS transistors are typically formed on a CMOS n-well. In applications where a shift in threshold voltages of CMOS transistors is tolerable, a PMOS transistor can be directly implemented in an HV n-well, such as the PMOS transistor with floating operation capability in the example of FIG. 6H. Implementing a PMOS transistor directly in an HV n-well has the advantage of allowing the process 600 to skip a CMOS n-well implant and masking step (while maintaining its thermal cycle), thereby potentially lowering the overall process manufacturing cost.

The SHDD with the combination of an implant depth about equal to the n+ region 516 and a dopant concentration greater than that used in the implant of the n-doped shallow drain but less than that used in the implant of the n+ region 516 provides a good $R_{dson}$ while increasing the safe operating area (SOA) of the transistor, i.e., the ability of the transistor to sustain high current with high drain voltage.

Figure 7A:
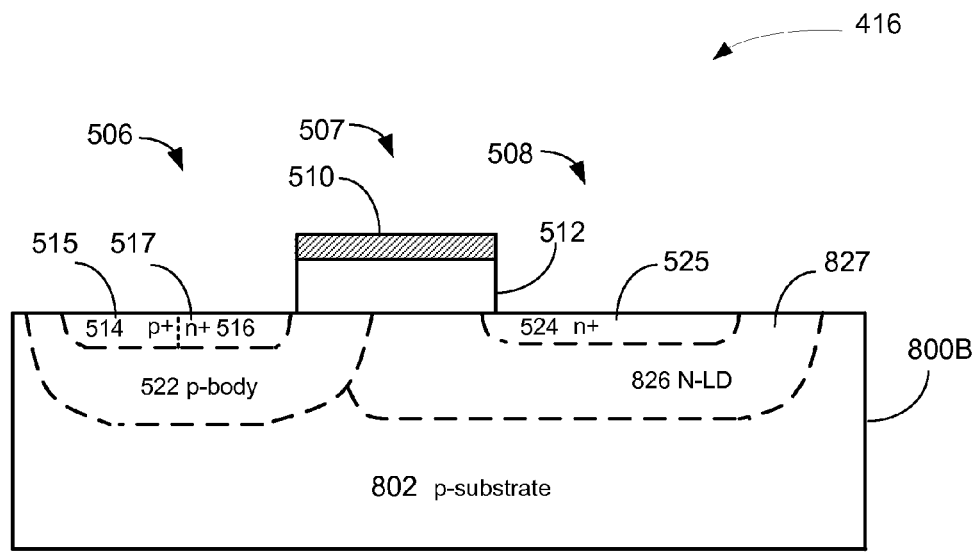
FIGS. 7A-7B are schematic cross-sectional views of an SHDD LDMOS transistor with an extended N-LD region, and a three-dimensional view of the surface area of the source and drain regions of the same, respectively.
Figure 7B:
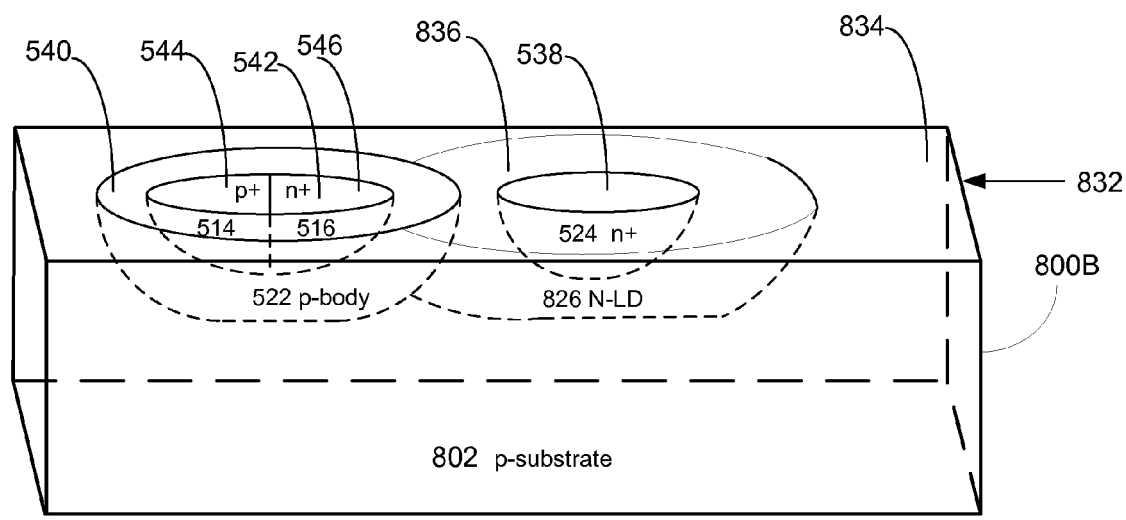

FIGS. 7A-7B illustrate yet other implementations of the LDMOS transistor 416. In these implementations, both SHDD region 518 is present (see FIGS. 4A-4B), and N-LD region 826 is extended under gate 507 (see FIGS. 7A-7B) to contact the p-body. In certain implementations, N-LD region 826 may also overlap with SHDD region 518 and/or n-doped n+ region 516. FIG. 7B illustrates the corresponding surface areas and volumes of these implementations. This configuration can provide a similar $R_{dson}$ in light of lower gate drive voltage.

The SHDD can be incorporated into transistor structures in a similar fashion as the N-LDS region described in U.S. Patent Publication No. 2007-0207600, the disclosure of which is incorporated by reference. A number of embodiments of the invention have been described. Nevertheless, it will be understood that various modifications may be made without departing from the spirit and scope of the invention. For example, the LDMOS transistor is not limited to DC-DC converter applications; the transistor may be used in applications such as LED drivers and RF amplifiers. Accordingly, other implementations are within the scope of the following claims.

What is claimed is:

1. A transistor comprising:
   a source including
      a p-doped p-body,
      a p-doped p+ region overlapping the p-body,
      a first n-doped n+ region overlapping the p-body in proximity to the p-doped p+region, and
      a n-doped source, heavily double-diffused (SHDD) region only in the source of the transistor, the SHDD region overlapping the p-body, the SHDD region having a depth about equal to that of the first n-doped n+ region and overlapping the first n-doped n+ region;
   a drain including
      a second n-doped n+ region, and
      an n-doped shallow drain overlapping the second n-doped n+ region; and
   a gate to control a depletion region between the source and the drain, the gate including a gate oxide and a conductive material over the gate oxide, the SHDD region extending further laterally than the first n-doped n+ region beneath the gate oxide, the first n-doped n+ region extending further laterally than the SHDD region toward the source;
   wherein the SHDD region is implanted using a dopant concentration greater than that used in the implant of the n-doped shallow drain but less than that used in the implant of the first n-doped n+ region.

2. The transistor of claim 1, wherein the second n-doped n+ region extends deeper than the n-doped shallow drain.

3. The transistor of claim 1, wherein the p-doped p+ region abuts the first n-doped n+ region.

4. A voltage regulator having an input terminal to be coupled to an input voltage source and an output terminal to be coupled to a load, comprising:
   a power switch including a transistor according to claim 1, a duty cycle of the power switch controlling power supplied to the output terminal; and
   a filter to provide a generally DC output voltage at the output terminal.

5. A transistor comprising:
   a source including
      a p-doped p-body,
      a p-doped p+ region overlapping the p-body,
      a first n-doped n+ region overlapping the p-body in proximity to the p-doped p+ region, and
      a n-doped source, heavily double-diffused (SHDD) region only in the source of the transistor, the SHDD region overlapping the p-body, a portion of the SHDD region overlapping the first n-doped n+ region;
   a drain including
      a second n-doped n+ region, and
      an n-doped shallow drain; and
   a gate to control a depletion region between the source and the drain, the gate including a gate oxide and a conductive material over the gate oxide, the SHDD region extending further laterally than the first n-doped n+ region beneath the gate oxide, the first n-doped n+ region extending further laterally than the SHDD region toward the source;
   wherein the n-doped shallow drain extends beneath the gate oxide to contact the p-doped p-body.

6. The transistor of claim 5, wherein the second n+ region extends deeper than the n-doped shallow drain.

7. The transistor of claim 5, wherein the second n-doped n+ region is self-aligned to the gate of the transistor.

8. The transistor of claim 5, wherein the first n-doped n+ region is surrounded by the p-body.

9. The transistor of claim 5, wherein the p-body is deeper than the p+region, the first n-doped n+ region and the SHDD region.

10. The transistor of claim 5, wherein the SHDD region is implanted to a depth about equal to that of the first n-doped n+ region.

11. The transistor of claim 5, wherein the SHDD region is implanted using an impurity concentration less than that used in the implant of the first n-doped n+ region.

12. The transistor of claim 5, wherein an outer boundary of the SHDD region is aligned with an outer boundary of the first n-doped n+ region.

13. The transistor of claim 5, wherein the p-doped p+ region abuts the first n-doped n+ region.

14. A voltage regulator having an input terminal to be coupled to an input voltage source and an output terminal to be coupled to a load, comprising:
   a power switch including a transistor according to claim 5, a duty cycle of the power switch controlling power supplied to the output terminal; and
   a filter to provide a generally DC output voltage at the output terminal.

* * * * *